United States Patent
Nimura et al.

(10) Patent No.: US 8,044,579 B2
(45) Date of Patent: Oct. 25, 2011

(54) ELECTROLUMINESCENT DEVICE WITH LIQUID-REPELLENT PORTION AND ELECTRONIC APPARATUS

(75) Inventors: Toru Nimura, Suwa (JP); Kozo Shitagami, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 237 days.

(21) Appl. No.: 12/036,472

(22) Filed: Feb. 25, 2008

(65) Prior Publication Data

US 2008/0231182 A1   Sep. 25, 2008

(30) Foreign Application Priority Data

Mar. 19, 2007   (JP) .................................. 2007-070901

(51) Int. Cl.
   *H01J 1/62*   (2006.01)
   *H01J 63/04*   (2006.01)
(52) U.S. Cl. ........................................ 313/506; 313/498
(58) Field of Classification Search .......... 313/498–512, 313/292
   See application file for complete search history.

(56) References Cited

U.S. PATENT DOCUMENTS

| | | | | |
|---|---|---|---|---|
| 2005/0073247 A1* | 4/2005 | Yamazaki et al. | ............ | 313/503 |
| 2005/0179373 A1* | 8/2005 | Kobayashi | ................... | 313/506 |
| 2005/0260337 A1* | 11/2005 | Ogura et al. | .................... | 427/66 |
| 2006/0119258 A1* | 6/2006 | Sakata et al. | .................. | 313/504 |
| 2006/0158108 A1* | 7/2006 | Hayashi | ....................... | 313/506 |
| 2006/0197445 A1* | 9/2006 | Watanabe | .................... | 313/512 |
| 2006/0290276 A1* | 12/2006 | Cok et al. | ....................... | 313/512 |
| 2007/0114521 A1* | 5/2007 | Hayashi et al. | ................. | 257/40 |
| 2007/0200491 A1* | 8/2007 | Seo et al. | ....................... | 313/504 |
| 2008/0203909 A1* | 8/2008 | Azuma | .......................... | 313/504 |

FOREIGN PATENT DOCUMENTS

| | | |
|---|---|---|
| JP | A 2003-100449 | 4/2003 |
| JP | A 2003-187962 | 7/2003 |
| JP | A 2003-223986 | 8/2003 |
| JP | A 2003-228302 | 8/2003 |
| JP | A 2003-297558 | 10/2003 |
| JP | A-2006-332019 | 12/2006 |

* cited by examiner

*Primary Examiner* — Joseph L Williams
*Assistant Examiner* — Kevin Quarterman
(74) *Attorney, Agent, or Firm* — Oliff & Berridge, PLC

(57) ABSTRACT

An electroluminescent device includes a first substrate being provided with a plurality of luminescent elements, a second substrate facing the first substrate with the plurality of luminescent elements therebetween, a desiccating agent covering the face of the first substrate at the side facing the second substrate or of the second substrate at the side facing the first substrate, and a liquid-repellent portion surrounding the desiccating agent and being repellent to a coating liquid for forming the desiccating agent.

8 Claims, 4 Drawing Sheets

ELECTROLUMINESCENT DEVICE WITH LIQUID-REPELLENT PORTION AND ELECTRONIC APPARATUS

BACKGROUND

1. Technical Field

The present invention relates to a method of sealing an electroluminescent device.

2. Related Art

Recently, electroluminescent devices (hereinafter "electroluminescent" may be abbreviated as "EL") have been used in displays of mobile devices, such as mobile phones and PDAs, and of personal computers. The EL devices are known that their luminescent portions are deteriorated by moisture or oxygen and therefore are indispensably required to have a highly hermetic sealing structure for preventing penetration of moisture and oxygen. For example, JP-A-2003-297558 (Patent Document 1) discloses a method for preventing deterioration of a luminescent element by providing a desiccating agent to a sealing substrate. As shown in FIG. 7, a dent D is formed on a sealing substrate 20 by blasting, and a desiccating agent 17 is applied to the dent D.

However, the structure shown in FIG. 7 has disadvantages that a cost for processing the sealing substrate 20 is additionally required and also that when the precision in ejection of the desiccating agent 17 is low, the desiccating agent 17 leaks from the dent D and corrodes a sealing material 30 to reduce the sealing performance thereof. Furthermore, in a top emission EL device, in which light is emitted from the sealing substrate 20 side, display quality may be decreased by light scattering caused by micro-roughness of the substrate 20 produced by the blasting.

SUMMARY

An advantage of some aspects of the invention is that an electroluminescent device in which a desiccating agent can be precisely disposed at a predetermined region can be provided. Furthermore, an electronic apparatus that is highly reliable and excellent in luminescent characteristics can be provided by using the electroluminescent device.

A electroluminescent device according to an aspect of the present invention includes a first substrate provided with a plurality of luminescent elements, a second substrate facing the first substrate with the plurality of luminescent elements therebetween, a desiccating agent covering the face of the first substrate at the side facing the second substrate or of the second substrate at the side facing the first substrate, and a liquid-repellent portion surrounding the desiccating agent and being repellent to a coating liquid for forming the desiccating agent. With this structure, the coating liquid of the desiccating agent is prevented from flowing out beyond the liquid-repellent portion and from spreading to a sealing region. Therefore, the sealing region is not corroded by the desiccating agent. Thus, an electroluminescent device having high sealing performance and excellent reliability can be provided.

In the present invention, the liquid-repellent portion is made of a resin film surrounding the periphery of the plurality of luminescent elements. The resin film is preferably made of the same material as that of a partition layer disposed between the plurality of luminescent elements. With this structure, the liquid-repellent portion and the partition layer can be formed by a single process to reduce the process cost. In addition, since the desiccating agent is disposed in the entire luminescent region containing the plurality of luminescent elements, an electroluminescent device having high sealing performance can be provided.

In the invention, it is preferable that the plurality of luminescent elements include a plurality of pixel electrodes, a luminescent layer disposed on the plurality of pixel electrodes, and a common electrode disposed on the luminescent layer and that the liquid-repellent portion surround the periphery of the common electrode. With such a structure, the desiccating agent is arranged on the entire surface of the common electrode to prevent oxidation of the functional layer disposed under the common electrode and attain sufficient reliability.

In the invention, it is preferable that the common electrode be laminated on common electrode wiring disposed at the periphery of the plurality of luminescent elements and be electrically connected to the common-electrode wiring at the lamination portion. With such as a structure, the electric connection between the common electrode and the common-electrode wiring can be surely achieved, and, at the same time, the sealing performance of the common electrode can be improved.

In the invention, it is preferable that the liquid-repellent portion be made of a resin film disposed between the plurality of luminescent elements. The resin film also serves as a partition layer for partitioning the plurality of luminescent elements. With such a structure, the liquid-repellent portion and the partition layer can be formed by a single process to reduce the process cost. In addition, since the desiccating agent is provided to each of the plurality of luminescent elements, an electroluminescent device having high sealing performance can be provided.

In the invention, it is preferable that the liquid-repellent portion include a plurality of light-transmissive liquid-repellent films planarly overlapping the respective ones of the plurality of luminescent elements. With such a structure, light absorption by the desiccating agent can be prevented. Therefore, in particular, a top emission-type electroluminescent device, in which light is extracted from the second substrate side, can attain high luminescent brightness.

In the invention, it is preferable that the liquid-repellent film selectively transmits light of a specific color or selectively transmits light of a specific polarization. With such a structure, the liquid-repellent portion can also serve as a color filter or a polarization layer. In such a case, the liquid-repellent portion is preferably disposed on the second substrate at the side facing the first substrate. With such a structure, a liquid-repellent portion (color filter or polarization layer) having high quality can be obtained without consideration of influence on the luminescent elements.

In the invention, it is preferable that the first substrate include a resin film insulating between the luminescent elements and switching elements for driving the luminescent elements and that the liquid-repellent portion be formed by exposing a part of the resin film to the surface of the first substrate. With such a structure, a process for forming the liquid-repellent portion can be reduced.

In the invention, it is preferable that the liquid-repellent portion surround the periphery of the plurality of luminescent elements. With such a structure, since the desiccating agent is disposed in the entire luminescent region, containing the plurality of luminescent elements, an electroluminescent device having high sealing performance can be provided.

In the invention, it is preferable that the plurality of luminescent elements include a plurality of pixel electrodes, a luminescent layer disposed on the plurality of pixel electrodes, and a common electrode disposed on the luminescent layer and that the liquid-repellent portion surround the periphery of the common electrode. With such a structure, the desiccating agent is arranged on the entire surface of the common electrode to prevent oxidation of the functional layer disposed under the common electrode and attain sufficient reliability.

In the invention, it is preferable that the common electrode be laminated on common-electrode wiring disposed at the periphery of the plurality of luminescent elements and be electrically connected to the common-electrode wiring at the lamination portion. With such a structure, the electric connection between the common electrode and the common-electrode wiring can be surely achieved, and the sealing performance of the common electrode can be improved.

An electronic apparatus according to an aspect of the invention includes an aforementioned electroluminescent device according to the invention. With such a structure, an electronic apparatus that is highly reliable and excellent in Luminescent characteristics can be provided.

BRIEF DESCRIPTION OF THE DRAWINGS

The invention will be described with reference to the accompanying drawings, wherein like numbers reference Like elements.

DESCRIPTION OF EXEMPLARY EMBODIMENTS

Figure 1:
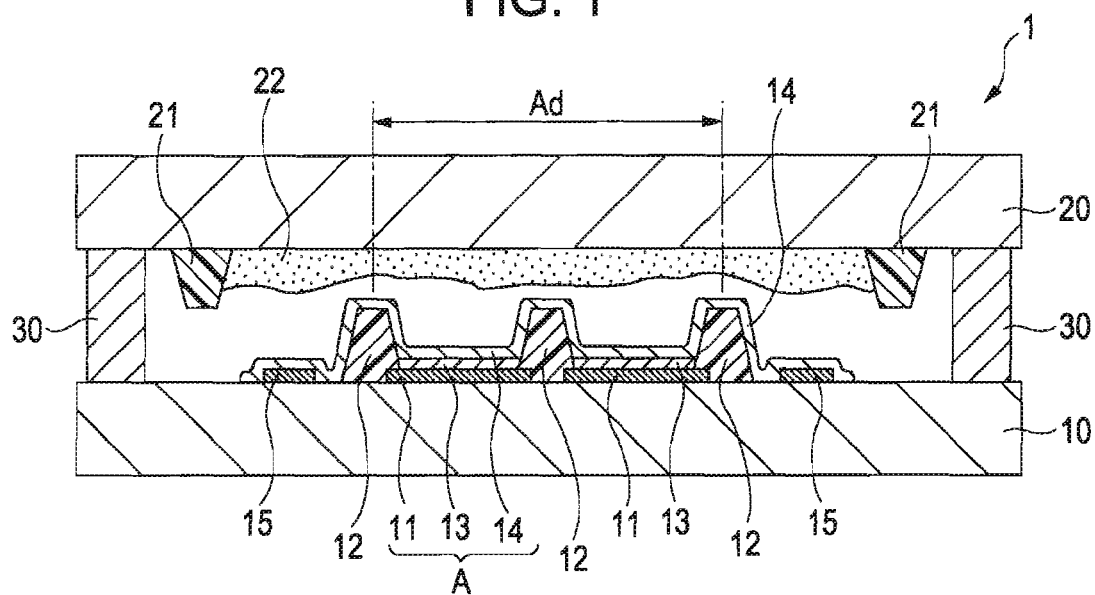
FIG. 1 is a schematic configuration view of an electroluminescent device according to a first embodiment of the invention.

The invention will now be described in conjunction with embodiments referring to the drawings. The embodiments are merely exemplary examples, and the invention is not limited thereto. In the following embodiments, shapes, combinations, and so on of each constituting member are merely examples and can be variously modified based on design requirement or the like in the range that does not apart from the scope of the invention. In the following drawings, dimensions, numbers, and so on of each mender are different from those of an actual structure for better understanding of each structure.

First Embodiment

FIG. 1 is a schematic configuration view of an organic EL device 1 according to a first embodiment of the invention. The organic EL device 1 includes a first substrate 10 and a second substrate 20 facing each other. The first substrate 10 and the second substrate 20 are adhered to each other with a sealing member 30 disposed at facing peripheries of the first substrate 10 and the second substrate 20. Furthermore, a plurality of luminescent elements A are disposed at the region surrounded by the sealing member 30, and the plurality of luminescent elements A constitute a luminescent portion Ad.

The first substrate 10 is provided with pixel electrodes (first electrode, 11, a partition layer 12, function layers 13, and a counter electrode (second electrode) 14 at the second substrate 20 side. The functional layer 13 is composed of at least one layer containing a luminescent layer. The pixel electrode 11, the functional layer 13, and the counter electrode 14 form an organic EL element A as the luminescent element, and a plurality of the organic EL elements A is disposed on the first substrate 10. The plurality of luminescent elements A forms the luminescent portion Ad. In FIG. 1, though only two organic luminescent elements A are drawn, actually, a large number of the organic EL elements A are one-dimensionally or two-dimensionally arrayed on the first substrate 10.

The functional layer 13 is formed at a region partitioned by the partition layer 12. The partition layer 12 is made of a resin film such as an acrylic resin and is formed in a lattice in a two-dimensional view so as to partition the pixel electrodes 11. The partition layer 12 has apertures on the pixel electrodes 11, and the functional layer 13 is laminated on each pixel electrode 11 exposing to the bottom of the aperture. The functional layer 13 may be provided with a layer in addition to the luminescent layer, such as a hole-injecting layer, a hole-transporting layer, an electron-transporting layer, or an electron-injecting layer, according to need.

The counter electrode 14 is disposed so as to cover the partition layer 12 and the functional layer 13. The counter electrode 14 covers the entire luminescent portion Ad and serves as a common electrode for all the pixel electrodes 11. The counter electrode 14 also covers the external face of the outermost periphery of the partition layer 12 and extends to the first substrate 10. Furthermore, counter-electrode wiring (common-electrode wiring) 15 is disposed at the periphery of the luminescent portion Ad. The counter electrode 14 is laminated on the counter-electrode wiring 15 and is electrically connected to the counter-electrode wiring 15 at the lamination portion.

The second substrate 20 is provided with a partition layer (liquid-repellent portion) 21 at the side facing the first substrate 10. The partition layer 21 is made of a resin layer such as an acrylic resin and the surface thereof is provided with liquid-repellent treatment such as fluorine plasma treatment. In this embodiment, the partition layer 21 is imparted with a liquid repellency by liquid-repellent treatment, but when the partition layer 21 is made of a liquid-repellent material (for example, a fluorine-containing resin) the liquid-repellent treatment is unnecessary.

The partition layer 21 has a shape of a closed frame surrounding the periphery of the luminescent portion Ad, and a desiccating agent 22 is disposed at the inner side than the partition layer 21. The desiccating agent 22 is formed by applying a solution of a desiccating agent to a region surrounded by the partition layer 21 and burning the solution at a high temperature. Any application-type desiccating agent can be used without particular limitation, and a known desiccating agent described in Patent Document 1 can be used. The application may be conducted by a dispenser method or an ink-jet method, but is not limited thereto. Since the surface of the partition layer 21 is repellent to the coating liquid of the desiccating agent 22, the coating liquid of the desiccating agent 22 is prevented from flowing out beyond the partition layer 21 and from spreading to the region of the sealing member 30. Accordingly, the desiccating agent 22 is certainly positioned in the region surrounded by the partition layer 21.

In the organic EL device 1 according to this embodiment, the coating liquid of the desiccating agent 22 is prevented from flowing out beyond the partition layer 21, and the sealing member 30 is not corroded by the desiccating agent. Therefore, an organic EL device having high sealing performance and excellent reliability can be provided.

Second Embodiment

Figure 2:
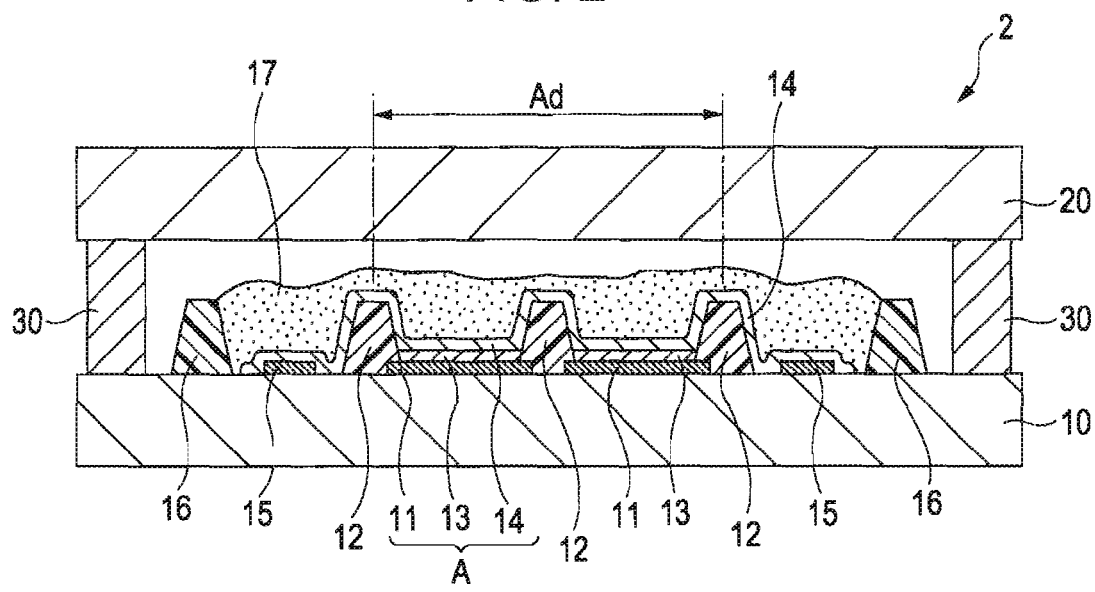
FIG. 2 is a schematic configuration view of an electroluminescent device according to a second embodiment of the invention.

FIG. 2 is a schematic configuration view of an organic EL device 2 according to a second embodiment of the invention. The basic structure of the organic EL device 2 is the same as that of the organic EL device 1 according to the first embodiment except that a partition layer 16 is disposed at the periphery of the luminescent portion Ad and a desiccating agent 17 is disposed in the region surrounded by the partition layer 16. Accordingly, the structural elements that are the same as those in the first embodiment are denoted by the same reference characters and detailed description thereof is not repeated.

As shown in FIG. 2, the partition layer (liquid-repellent portion) 16 is disposed at the periphery of the luminescent portion Ad, namely, at the outer side than the counter-electrode wiring 15 (at the opposite side of the luminescent portion Ad with respect to the counter-electrode wiring 15) The partition layer 16 is made of a resin film such as an acrylic resin, and the surface thereof is provided with liquid-repellent treatment such as fluorine-plasma treatment. The partition layer 16 is made of the same material as that of the partition layer 12 and is formed together with the partition layer 12 by a single process. For example, the partition layer 12 is subjected to liquid-repellent treatment such as fluorine-plasma treatment before the application of a solution of the functional layer 13, and, on this occasion, the liquid-repellent treatment is also applied to the partition layer 16 at the same time. In this embodiment, the partition layer 16 is imparted with a liquid repellency by liquid-repellent treatment, but when the partition layer 16 is made of a liquid-repellent material (for example, a fluorine-containing resin), the liquid-repellent treatment is unnecessary.

The partition layer 16 has a shape of a closed frame surrounding the periphery of the luminescent portion Ad. A desiccating agent 17 is disposed at the inner side than the partition layer 16. The desiccating agent 17 is formed by applying a solution of a desiccating agent to the region surrounded by the partition layer 16 and burning the solution at a high temperature. The desiccating agent 17 covers the entire face of the counter electrode 14 and can certainly inhibit penetration of moisture and oxygen to the counter electrode 14.

The material of the desiccating agent 17 may be the same as that of the desiccating agent 22 in the first embodiment. Since the surface of the partition layer 16 is provided with liquid-repellent treatment, the solution of the desiccating agent 17 is prevented from flowing out beyond the partition layer 16 and from spreading to the region of the sealing member 30. Accordingly, the desiccating agent 17 is certainly formed in the region surrounded by the partition layer 16.

In the organic EL device 2 according to this embodiment, the partition layer 16 and the partition layer 12 can be formed by a single process to reduce the process cost. In addition, since the desiccating agent 17 is disposed on the entire luminescent portion Ad, an organic EL device having high sealing performance can be provided. In particular, the desiccating agent 17 covers the entire face of the counter electrode 14 to prevent oxidation of the functional layer disposed under the counter electrode 14 and attain sufficient reliability.

Third Embodiment

Figure 3:
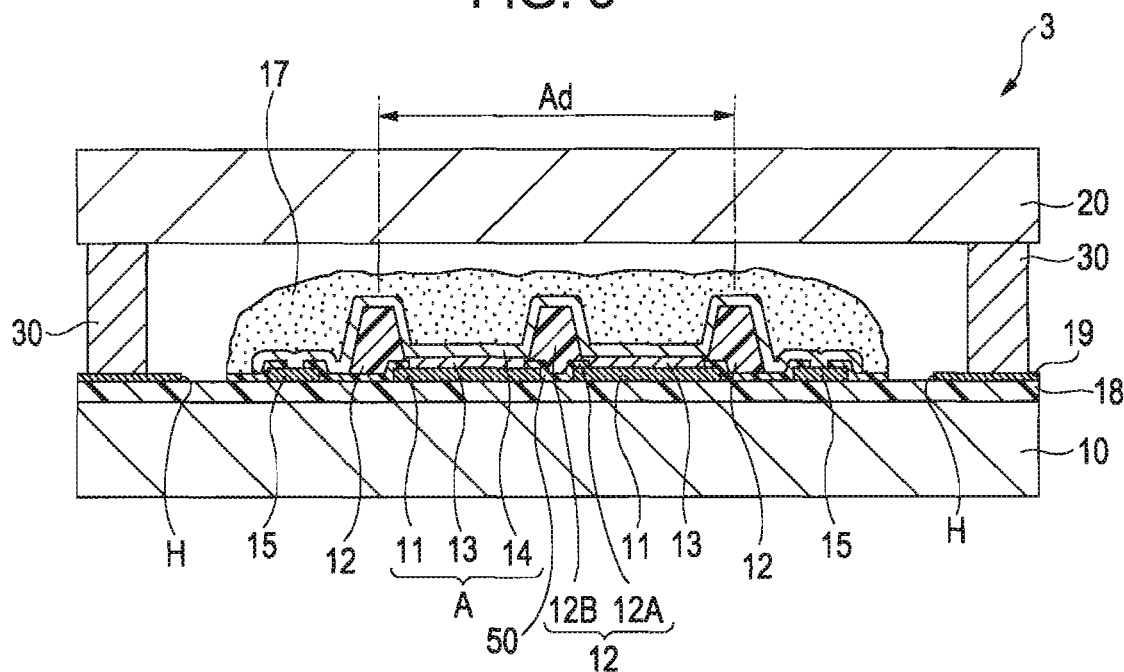
FIG. 3 is a schematic configuration view of an electroluminescent device according to a third embodiment of the invention.

FIG. 3 is a schematic configuration view of an organic EL device 3 according to a third embodiment of the invention. The basic structure of the organic EL device 3 is the same as that of the organic EL device 2 according to the second embodiment except that the liquid-repellent portion is formed by exposing of a base resin film at the periphery of the luminescent portion Ad. Accordingly, the structural elements that are the same as those in the second embodiment are denoted by the same reference characters and detailed description thereof is not repeated.

As shown in FIG. 3, organic EL elements A and a resin film 18 are disposed on a first substrate 10. The resin film 18 insulates the organic EL elements A from pixel-switching elements for driving the organic EL elements A. On the resin film 18, a luminescent portion Ad including pixel electrodes (first electrode) 11, a partition layers 12, 19 and 50, functional layers 13, and a counter electrode (second electrode) 14 is disposed.

The partition layer 12 includes a first partition layer 12A made of an inorganic insulating film and a second partition layer 12B made of an organic insulating film. The first partition layer 12A has an aperture on the pixel electrode 11, so as to overlap the pixel electrode 11 at only the periphery of the pixel electrode 11. The second partition layer 12B is laminated on the first partition layer 12A. The second partition layer 12B has an aperture that is communicated with the aperture of the first partition layer 12A on the pixel electrode 11, and the functional layer 13 is laminated on the pixel electrode 11 exposing to the bottom of the apertures.

The partition layer 12 includes a first partition layer 12A made of an inorganic insulating film and a second partition layer 12B made of an organic insulating film. Partition lavers 19 and 50 are also made of an inorganic insulating film. The first partition layer 12A has an aperture on the pixel electrode 11 so as to overlap the pixel electrode 11 at only the periphery of the pixel electrode 11. The second partition layer 12B is laminated on the first partition layer 12A. The second partition layer 12B has an aperture that is communicated with the aperture of the first partition layer 12A on the pixel electrode 11, and the functional layer 13 is laminated on the pixel electrode 11 exposing to the bottom of the apertures.

The resin film (liquid-repellent portion) 18 is made of a resin film such as an acrylic resin, and the surface thereof is provided with liquid-repellent treatment such as fluorine plasma treatment. The liquid-repellent treatment to the resin film 18 is conducted at the same time with the liquid-repellent treatment of the partition layer 12. For example, the partition layer 12 is subjected to the liquid-repellent treatment such as fluorine plasma treatment before the application of a solution of the functional layer 13. On this occasion, the liquid-repellent treatment is also applied to the resin film 18 at the same time. In this embodiment, the resin layer 18 is imparted with a liquid repellency by liquid-repellent treatment, but when the resin film (organic insulating film) 9S is made of a liquid repellent material (for example, a fluorine-containing resin), the liquid-repellent treatment is unnecessary.

The aperture H has a shape of a closed frame surrounding the periphery of the luminescent portion Ad. A desiccating agent 17 is disposed at the inner side than the aperture H. The desiccating agent 17 is formed by applying a solution of a desiccating agent to the region surrounded by the aperture H and burning the solution at a high temperature. The desiccating agent 17 covers the entire face of the counter electrode 14 and can certainly inhibit penetration of moisture and oxygen to the counter electrode 14.

The material of the desiccating agent 17 may be the same as that of the desiccating agent 22 in the first embodiment. Since the bottom face of the aperture ES (the surface of the resin film 18) is provided with liquid-repellent treatment, the solution of the desiccating agent 17 is prevented from flowing out beyond the aperture H and from spreading to the region of the sealing member 30. Accordingly, the desiccating agent 17 is certainly formed in the region surrounded by the frame-shaped aperture H.

In the organic ET, device 3 according to this embodiment; the aperture H serving as a liquid-repellent portion and the partition layer 12 (first partition layer 12A) can be formed by a single process to reduce the process cost. In addition, since the desiccating agent 17 is disposed on the entire luminescent portion Ad, an organic EL device having high sealing performance can be provided. In particular, the desiccating agent 17 covers the entire face of the counter electrode 14 to prevent oxidation of the functional layer disposed under the counter electrode 14 and attain sufficient reliability.

Fourth Embodiment

Figure 4:
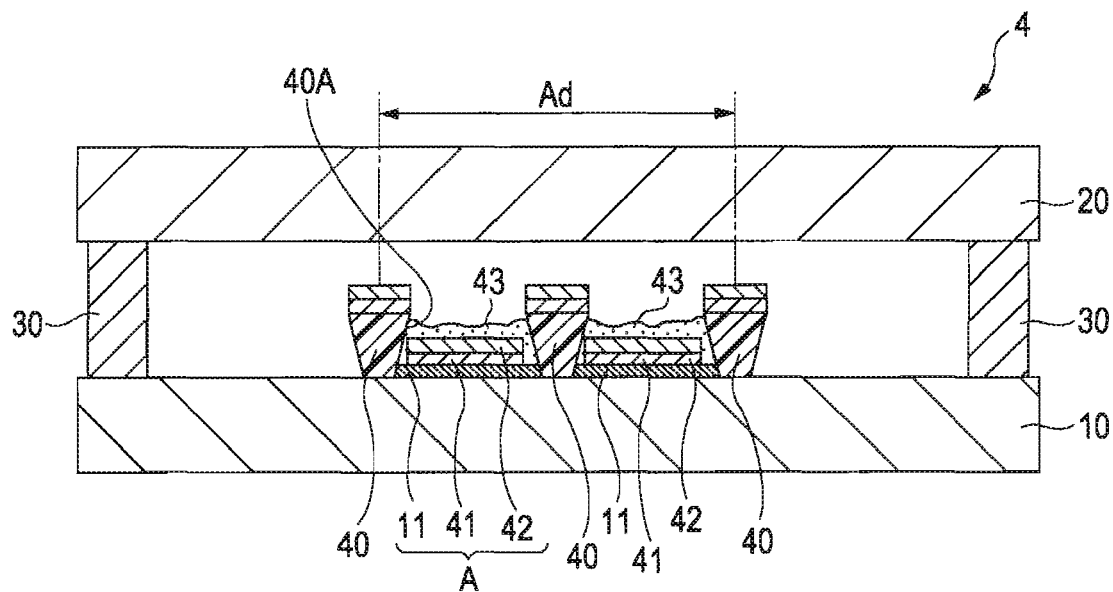
FIG. 4 is a schematic configuration view of an electroluminescent device according to a fourth embodiment of the invention.

FIG. 4 is a schematic configuration view of an organic EL device 4 according to a fourth embodiment of the invention. In the organic EL device 4, the structural elements that are the same as those of the organic EL device 1 in the first embodiment are denoted by the same reference characters and detailed description thereof is not repeated.

On a first substrate 10, pixel electrodes (first electrode) 11, a partition layer 40, function layers 41, and a counter electrode (second electrode) 42 are disposed. The functional layer 41 is composed of at least one layer containing a luminescent layer. The pixel electrode 11, the functional layer 41, and the counter electrode 42 form an organic EL element A as the luminescent element, and a plurality of the organic EL elements A is disposed on the first substrate 10. The plurality of luminescent elements A forms a luminescent portion Ad. In FIG. 4, though only two organic ELI elements A are drawn, actually, a large number of the organic EL elements A are one-dimensionally or two-dimensionally arrayed on the first substrate 19.

The functional layer 41 is formed at a region partitioned by the partition layer 40. The partition layer 40 is formed along the gaps between the pixel electrodes 11 in stripes in a two-dimensional view so as to partition the pixel electrodes 11. The partition layer 40 has stripe-like apertures 40A on the pixel electrodes 11, and the functional layer 41 is vapor-deposited on each pixel electrode 11 exposing to the bottom of the aperture 40A. The aperture of the partition layer 40 has a reversely tapered cross-section in which the aperture is narrowed with the distance from the first substrate 10. The functional layer 41 is also vapor-deposited on the top face of the partition layer 40, but the functional layer deposited on the top face of the partition layer and the functional layer deposited on the pixel electrode 11 are cut from each other at the edge of the top face of the partition layer. Furthermore the functional layer 41 may be provided with a layer in addition to the luminescent layer, such as a hole-injecting layer, a hole-transporting layer, an electron-transporting layer, or an electron-injecting layer, according to need.

The counter electrode 42 is vapor-deposited on the functional layer 41. The counter electrode 42 is also vapor-deposited on the top face of the partition layer 40, but the counter electrode deposited on the top face of the partition layer and the counter electrode 42 deposited on the functional layer 41 are cut from each other at the edge of the top face of the partition layer. Consequently, the counter electrodes 42 are arrayed in stripes at the apertures 40A of the partition layer 40, and each of the counter electrodes 42 functions as a common electrode for a plurality of pixel electrodes 11 arrayed along the stripe.

The partition layer (liquid-repellent portion) 40 is made of a resin film such as an acrylic resin, and the surface thereof is provided with liquid-repellent treatment such as fluorine plasma treatment. The apertures 40A of the partition layer 40 are provided with a desiccating agent 43. The desiccating agent 43 is formed by applying a solution of a desiccating agent to the aperture 40A (region surrounded by the partition layer 40) of the partition layer 40 and burning the solution at a high temperature. The desiccating agent 43 covers the entire face of the counter electrode 42 disposed in the aperture 40A and can certainly inhibit penetration of moisture and oxygen to the counter elect-ode 42. In this embodiment the partition layer 40 is imparted with a liquid repellency by liquid-repellent treatment, but when the partition layer 40 is made of a liquid-repellent material (for example, a fluorine-containing resin), the liquid-repellent treatment is unnecessary.

The material of the desiccating agent 43 may be the same as that of the desiccating agent 22 in the first embodiment. Since the surface of the partition layer 40 is provided with liquid-repellent treatment, the solution of the desiccating agent 43 is prevented from flowing out beyond the partition layer 40 and from spreading to the region of the sealing member 30. Accordingly, the desiccating agent 43 is certainly formed in the region surrounded by the partition layer 40.

In the organic EL device 4 according to this embodiment, since the partition layer 40 serves as a liquid-repellent portion for preventing the desiccating agent 43 from spreading, the process forming the liquid-repellent portion can be omitted. In addition, since the desiccating agent 43 is provided to each organic EL element A, an organic EL device having high sealing performance can be provided.

Fifth Embodiment

Figure 5:
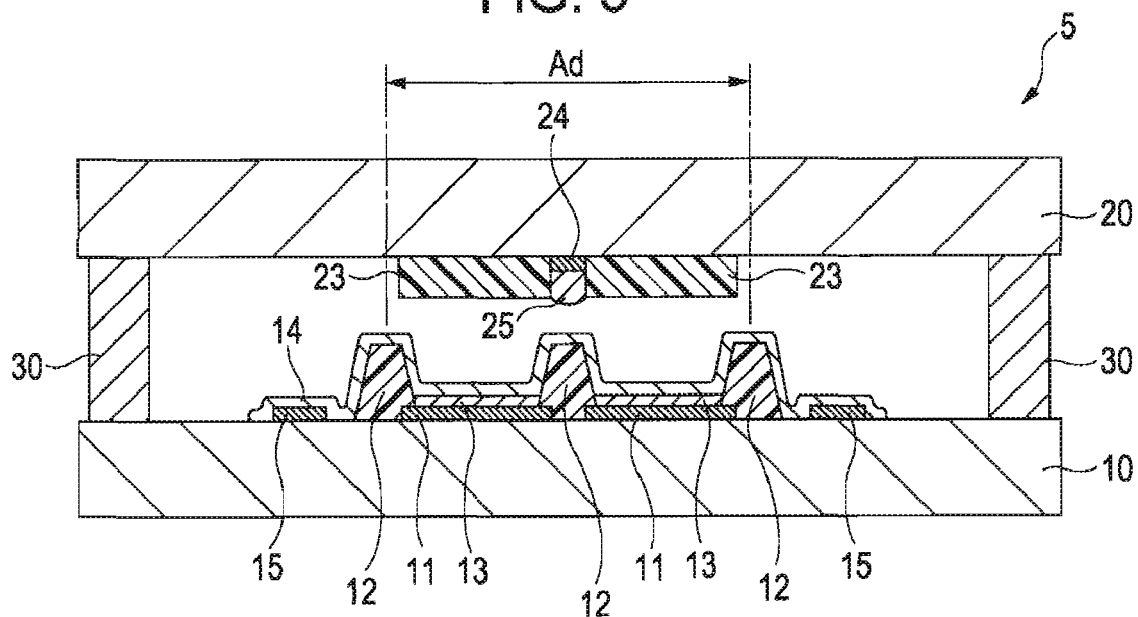
FIG. 5 is a schematic configuration view of an electroluminescent device according to a fifth embodiment of the invention.

FIG. 5 is a schematic configuration view of an organic EL device 5 according to a fifth embodiment of the invention. The basic structure of the organic EL device 5 is the same as that of the organic EL, device 1 according to the first embodiment except that the liquid-repellent portion for preventing the desiccating agent from spreading also serves as another optical member. Accordingly, the structural elements that are the same as those in the first embodiment are denoted by the same reference characters and detailed description thereof is not repeated.

As shown in FIG. 5, a light-transmissive optical member 23 that transmits the light emitted by an organic EL element A is provided on the second substrate 20 in a region facing the organic EL element A. The optical member (liquid-repellent film) 23 is made of a resin film such as an acrylic resin, and the surface thereof is provided with liquid-repellent treatment such as fluorine plasma treatment. In this embodiment, the optical member 23 is imparted with a liquid repellency by liquid-repellent treatment, but when the optical member 23 is made of a liquid-repellent material (for example, a fluorine-containing resin), the liquid-repellent treatment is unnecessary.

The optical member 23 has functions such as transmission or polarization of light having a specific wavelength. In this embodiment, for example, the optical member 23 is a color filter that selectively transmits light of a specific color, but may be a polarization layer that selectively transmits light of a specific polarization. Furthermore, a light-shielding layer 24 is disposed between adjacent optical members 23. The light-shielding layer 24 is made of an inorganic film such as chromium (Cr) and is lyophilic to the desiccating agent 24.

The optical member 23 is provided to correspond to each of the plurality of organic EL, elements A. In this embodiment, since the organic EL elements A (pixel electrode 11) are arrayed in a matrix on the first substrate 10, the optical members 23 are disposed in a matrix on the second substrate 20, and the light shielding layers 24 are disposed in a grid along the gaps between the optical members 23.

A desiccating agent 25 is formed by applying a solution of a desiccating agent to the gap (a region surrounded by the optical members 23) between the optical members 23 and burning the solution at a high temperature. The material of the desiccating agent 25 may be the same as that of the desiccating agent 22 in the first embodiment. Since the surface of the optical member 23 is provided with liquid-repellent treatment, the solution of the desiccating agent 25 does not flow out beyond the optical member 23 and therefore does not spread to the region of the sealing member 30. Therefore, the desiccating agent 25 is certainly formed in the region surrounded by the optical member 23.

In the organic EL device 5 according to this embodiment, since the optical member 23 also serves as a liquid-repellent portion for preventing the desiccating agent 25 from spreading, the process for forming the liquid-repellent portion can be omitted, In addition, since the desiccating agent 25 is disposed not to planarly overlap with the organic EL element A, light absorption by the desiccating agent 25 can be prevented. Therefore, in particular, a top emission-type organic EL device, in which light is extracted from the second substrate side, can attain nigh luminescent brightness. Furthermore, since the optical member 23 is provided on the second substrate 20, the optical member 23 having high quality can be obtained without consideration of influence on the organic EL element A.

Electronic Apparatus

Figure 6:
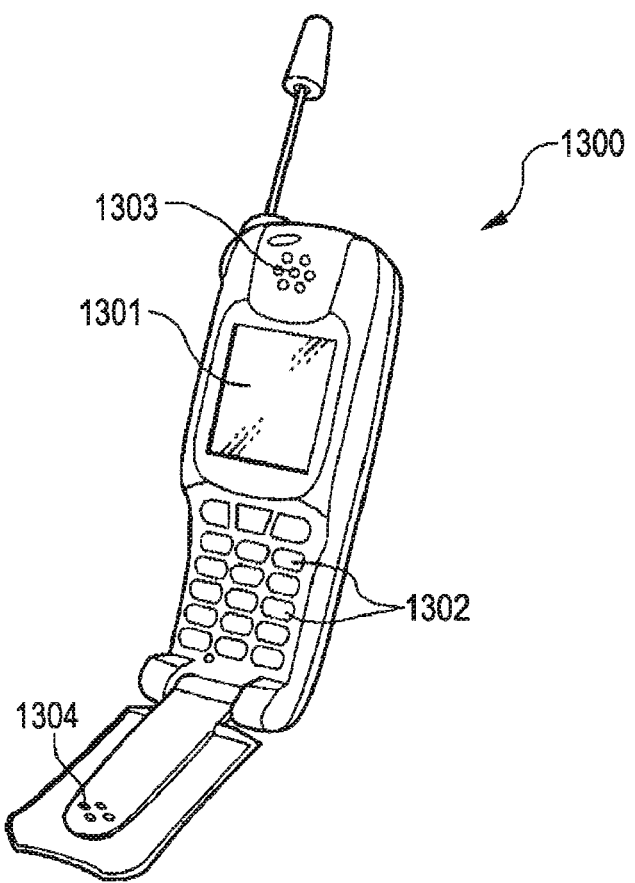
FIG. 6 is a schematic configuration view of a mobile phone as an electronic apparatus according to an embodiment of the invention.
Figure 7:
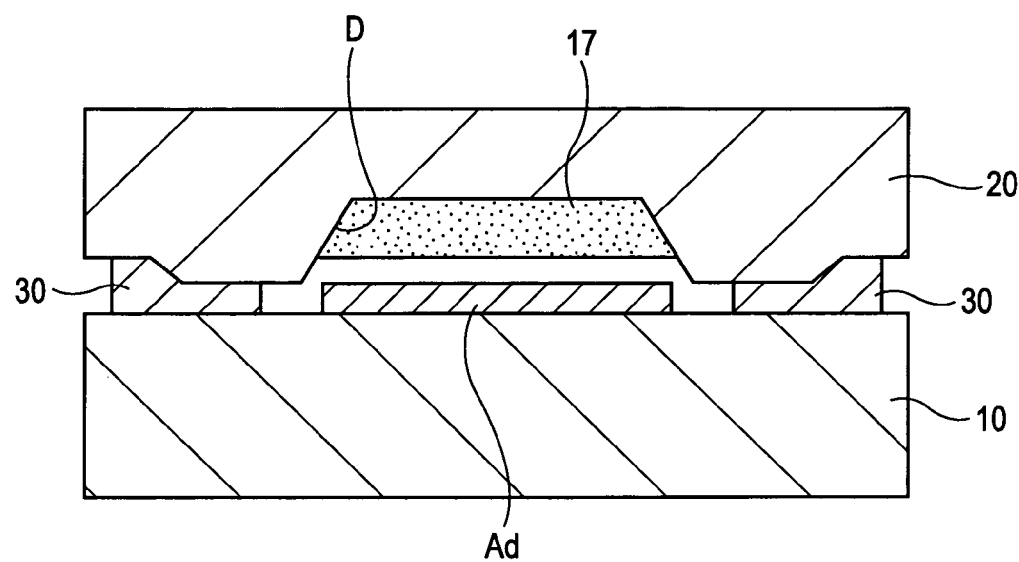
FIG. 7 is a schematic configuration view of a known electroluminescent device.

With reference to FIG. 6, an electronic apparatus including an EL device according to the invention will now be described. FIG. 6 is a schematic configuration view of a mobile phone 1300 as an electronic device according to an embodiment of the invention. The mobile phone 1300 includes the organic EL device 1 of the above-described embodiment as a small-size display 1301 and Further includes a plurality of operation buttons 1302, an earpiece 1303, and a mouthpiece 1304. The organic EL device 1 can be suitably used as an image display of not only the mobile phone but also electronic apparatuses, such as electronic books, projectors, personal computers, digital still cameras, television receivers, view finder-type or monitor direct view-type video cassette recorders, car navigation systems, pagers, electronic diaries, calculators, word processors, workstations, videophones, POS terminals, and, devices provided with touch panels. Thus, an electronic apparatus that is highly reliable and excellent in luminescent characteristics can be provided.

The entire disclosure of Japanese Patent Application No. 2007-070901, filed Mar. 19, 2007 is expressly incorporated by reference herein.

What is claimed is:

1. An electroluminescent device comprising:
   a first substrate on which a plurality of luminescent elements are formed;
   a second substrate arranged on a side of the first substrate on which the plurality of luminescent elements are formed;
   a plurality of optical members formed on the first substrate side of the second substrate;
   a shielding film formed between the plurality of optical members;
   a desiccating agent formed on the shielding film;
   the plurality of optical members being provided with liquid repellency with respect to a solution of the desiccating agent; and
   the shielding film being more lyophilic than the plurality of optical members with respect to the solution of the desiccating agent.

2. The electroluminescent device as set forth in claim 1, at least part of the desiccating agent being positioned between the plurality of optical members.

3. The electroluminescent device as set forth in claim 1, the plurality of optical members being arranged so as to respectively overlap the plurality of luminescent elements in plan view.

4. The electroluminescent device as set forth in claim 1, the plurality of optical members selectively transmitting predetermined colored light.

5. The electroluminescent device as set forth in claim 1, the plurality of optical members selectively transmitting predetermined polarized light.

6. An electronic device comprising the electroluminescent device as set forth in claim 1.

7. The electroluminescent device as set forth in claim 1, the liquid repellency of the plurality of optical members using fluorine.

8. The electroluminescent device as set forth in claim 1, the desiccating agent physically contacting the shielding film.

* * * * *